Figure 1:
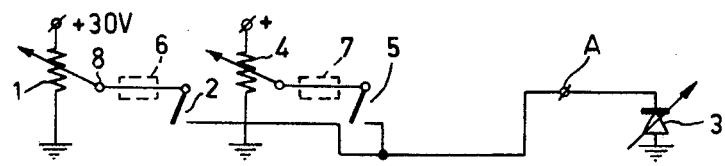

United States Patent [19]

Kröner et al.

[11] 4,090,124
[45] May 16, 1978

[54] CIRCUIT ARRANGEMENT FOR SWITCHING A TUNING VOLTAGE WITH LOW SWITCH OFFSET VOLTAGES AND TEMPERATURE COMPENSATION

[75] Inventors: Klaus Kröner, Hamburg, Germany; Wilhelmus Antonius Joseph Marie Zwijsen, Eindhoven, Netherlands

[73] Assignee: U.S. Philips Corporation, New York, N.Y.

[21] Appl. No.: 698,870

[22] Filed: Jun. 23, 1976

Related U.S. Application Data

[63] Continuation of Ser. No. 395,019, Sep. 7, 1973, abandoned.

[30] Foreign Application Priority Data

May 25, 1973 Germany .............................. 2326655
Sep. 9, 1972 Germany .............................. 2244283

[51] Int. Cl.² ................................................ H03J 5/24
[52] U.S. Cl. .......................................... 323/19; 323/1; 330/257; 334/15

[58] Field of Search .................... 307/296, 297, 320; 325/422; 330/22, 40, 69, 256, 257, 296, 297; 334/15; 323/1, 4, 16, 19, 22 T

[56] References Cited

U.S. PATENT DOCUMENTS

| 3,610,955 | 10/1971 | Blaser et al. ...................... 330/69 X |
| 3,649,926 | 3/1972 | Hill ..................................... 330/69 X |
| 3,689,848 | 9/1972 | Geffe et al. ........................ 330/69 X |
| 3,735,151 | 5/1973 | Frederiksen et al. ............ 330/40 X |
| 3,761,741 | 9/1973 | Hoeft ................................. 330/69 X |
| 3,781,699 | 12/1973 | Sakamoto ........................ 330/22 X |
| 3,786,344 | 1/1974 | Davis et al. ....................... 323/4 X |
| 3,914,700 | 10/1975 | Allner ............................... 334/15 X |

*Primary Examiner*—A. D. Pellinen
*Attorney, Agent, or Firm*—Frank R. Trifari; Henry I. Steckler

[57] ABSTRACT

A switch for a varicap tuner has a differential amplifier. A feedback circuit comprising a current mirror and a feedback amplifier ensures equal current flow in the difference amplifier transistors, and thereby ensures temperature compensation.

5 Claims, 5 Drawing Figures

CIRCUIT ARRANGEMENT FOR SWITCHING A TUNING VOLTAGE WITH LOW SWITCH OFFSET VOLTAGES AND TEMPERATURE COMPENSATION

This is a continuation, of application Ser. No. 395,019, filed Sept. 7, 1973 now abandoned.

The invention relates to a circuit arrangement for a television or radio receiver for switching the tuning voltage of a preset tuning potentiometer to the tuning element by means of a switch which is activated when operating an operating device.

Such circuit arrangements are known from "Funkrechnik,"1971, No. 9, pages 330, 332 and 333. Particularly FIG. 1 on page 330 shows the principle. A pulse is applied to an electronic switch from the operating device thus, for example, from the so-called sensor faces, which pulse connects the relevant or associated preset potentiometer to the tuning element, for example, the variable capacity diode. It has been found that mistuning of the variable capacity diodes at voltage variations in the order of 10 mV is already sufficient to mistune the preset transmitter in an inadmissible manner, (for example, a maximum of 20 MHz/V in case of UHF).

In the known circuit arrangement described in "Funktechnik" discrete elements are used. The 30 V voltage is applied to the desired preset tuning potentiometer by means of an electronic switch. In that case decoupling diodes are necessary (D 1001 and D 1002 in FIG. 4) in order that the other unwanted tuning potentiometers do not load or even short-circuit the tuning voltage. In order to reduce a temperature fluctuation caused by these diodes a further diode (D 1007) is necessary for the purpose of compensation in the common feet of the potentiometers.

This circuit arrangement is also available as an integrated circuit (for example Siemens SAS 560). In any case the decoupling diodes are, however, required as discrete elements because otherwise more than 16 connections are to be provided for the IC for four programs. The greatest drawback of such a circuit arrangement is the incomplete temperature compensation of the tuning voltage so that an excessively large temperature variation is produced and an automatic frequency control (AFC) will be necessary in the television receiver. On the other hand the use of all discrete and extra elements is to be prevented due to the high manufacturing (wages) costs.

To eliminate these drawbacks an electronic circuit was developed which, unlike the above described circuit arrangement, applies the preset voltages originating from the tuning potentiometers to the switch inputs and then only applies the selected or desired voltage to the switch output and thus to the tuning diode of the channel selector. Thus a so-called floating switch is provided for an analog signal (= tuning voltage) further denoted as an analog switch.

Analog switch is known in principle and is used with discrete elements (see "Funkschau" No. 17/1971, pages 531–534). As a result a drift of the tuning voltage of only 0.6 mV/° C is produced. A corresponding circuit arrangement also became known which is integrated (SN 29710 N and SN 29711 N and a later development SN 16789/799 of Texas Instrument Corporation). These have a drift of 0.3 mV/° C.

In an analog switch a switching transistor or a switching diode requires current when they are switched on. This current is taken from the wiper on the tuning potentiometer and dependent on its value it varies the tuning voltage. Since tuning potentiometers of 100 kOhm are concerned (potentiometers of a lower resistivity would too much load the stabilized 30 V voltage because eight potentiometers are fed in parallel for eight programs) a source resistance of 25 kOhms, at a maximum is produced on the taps of the poteniometers. The current taken from the potentiometers and being also dependent on the temperature in semiconductor circuits, for example, due to the temperature dependence of the current amplification, is thus to be lower than $1\mu A$ so that for a temperature variation of, for example, 50° C a current variation of less than $0.1\ \mu uA$ becomes possible. A current variation of $0.1\mu uA$ is then found to result in a variation of the tuning voltage of 2.5 mV at 25 kOhm, i.e. 0.05 MV/° C.

Figure 3:
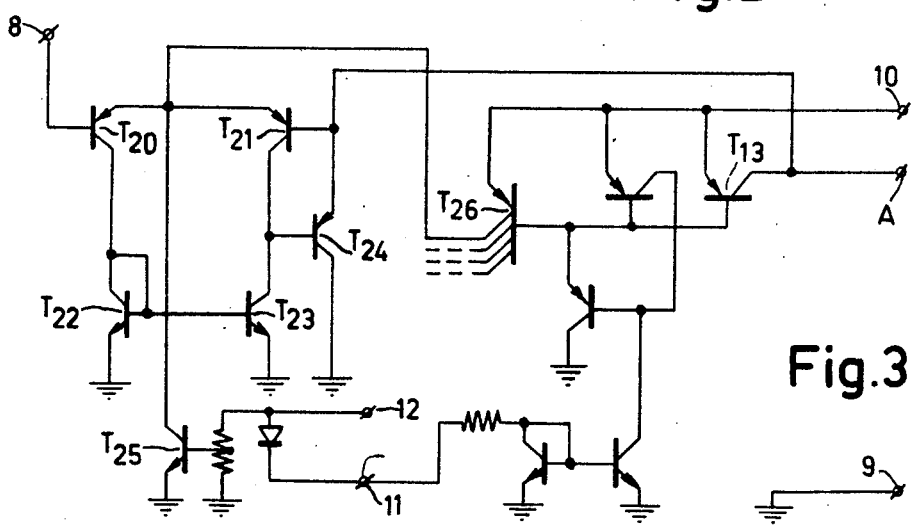

In the discrete circuit arrangement of FIG. 3 in "Funktechnik" the emitter current of the switching transistors is present across the wiper on the tuning potentiometer. Dependent on the tuning voltage a base current of, for example, $0 \ldots 30\mu A$ flows (through the base resistor of 1 mOhm) and also a collector current required by the following impedance converter. The sum thus results in a respectable emitter current of more than $30\mu A$ under some circumstances.

It is an object of the invention to provide an electronic switch which cannot only be manufactured easily but also switches the tuning voltage without a load on the tuning potentiometers and is resistant to temperature fluctuations.

According to the invention this object is achieved in that the switch associated with the tuning potentiometer is provided with an impedance converter resistant to temperature fluctuations and provided with semiconductor elements through which substantially equal currents flow while the switch is equipped with temperature-compensating semiconductor elements through which substantially equal currents flow. Furthermore the semiconductor elements of the impedance converter may be provided and formed in such a manner that they also serve as a switch.

By forming the above-mentioned curcuit arrangement in the IC technique it is possible to use a direct supply voltage of 30 V and to provide a very small element.

In the circuit arrangement according to the invention an impedance converter is connected behind the tuning potentiometer. This converter is operated by such a low emitter current that a base current of less than $1\mu A$ is necessary at the input of the impedance converter so that the tuning voltage adjusted at the tuning potentiometer is loaded with less than $1\mu A$.

To obtain a satisfactory temperature compensation of the base emitter voltages of the impedance converter it is formed as a difference amplifier whose second input which in this case is identical to the output of the impedance converter is adjusted by a control voltage (or a negative feedback) in such a manner that an approximately equal current is adjusted in the two transistors of the difference amplifier. This is a condition for a satisfactory temperature compensation of the base emitter voltages.

Such an impedance converter is known. The above-mentioned advantages may, however, be obtained by combination of this impedance converter with a temperature-compensated switch between the tuning potentiometer and the tuning element.

Embodiments of the invention are shown in the drawing and are further described hereinafter.

Figure 2:
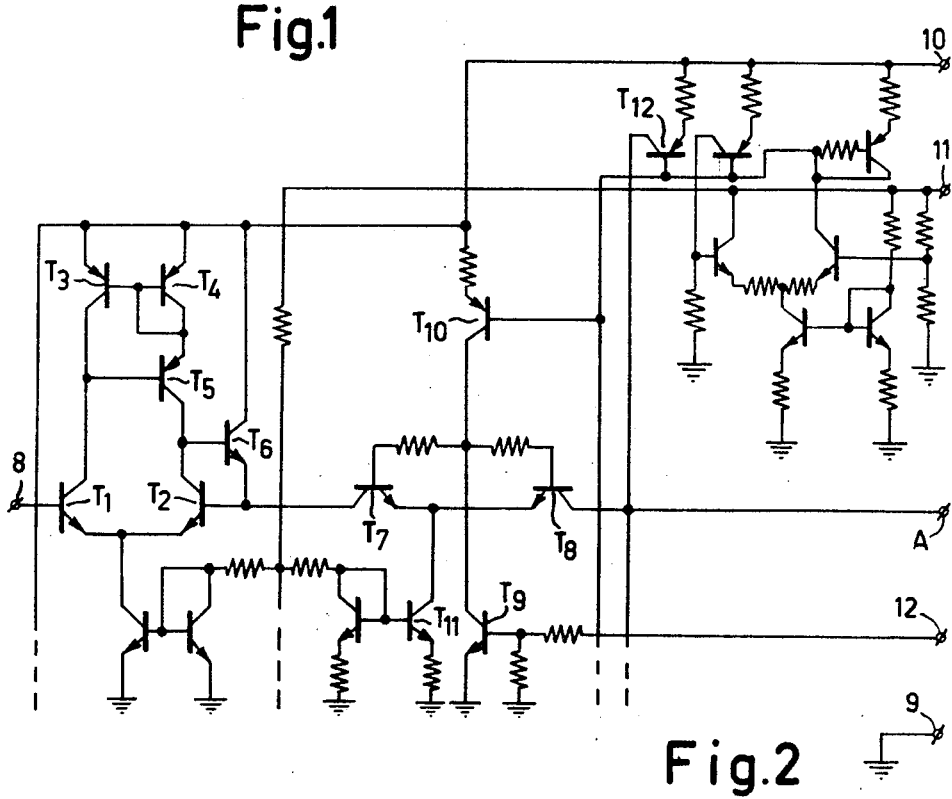
Figure 4:
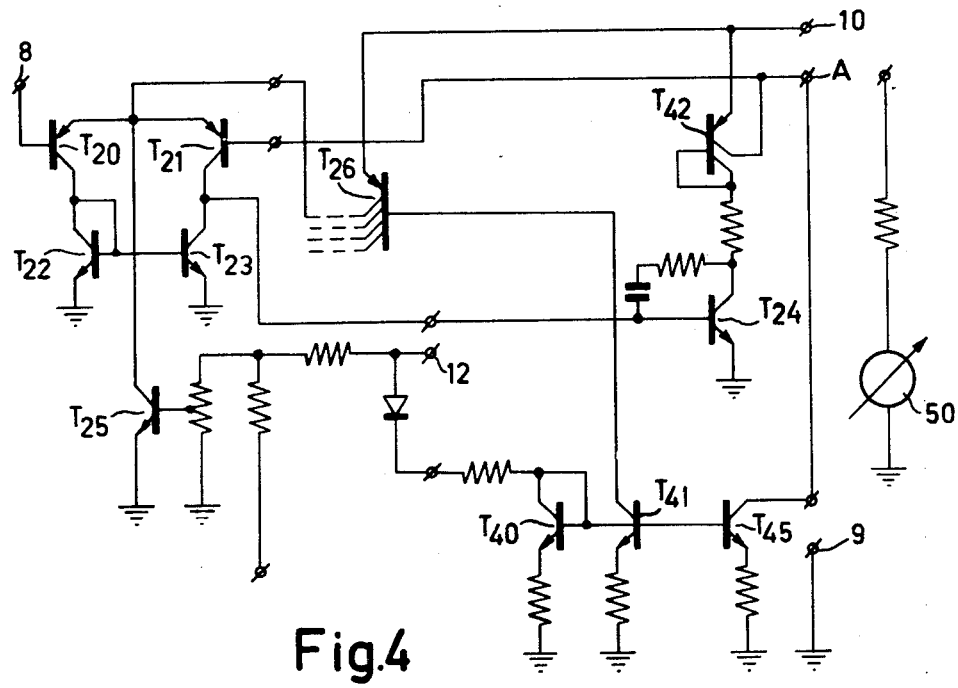
Figure 5:
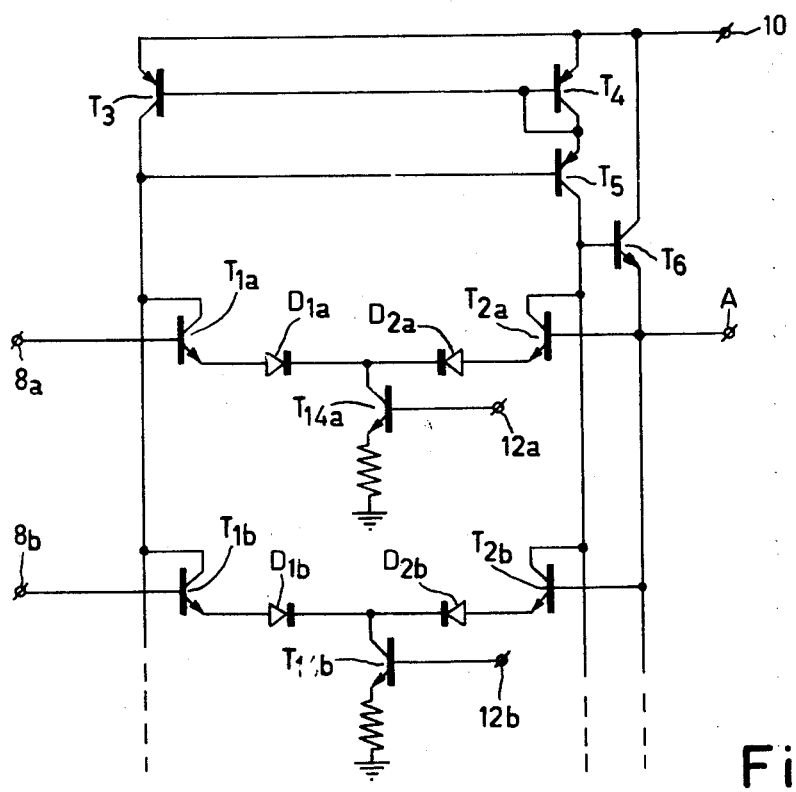

FIG. 1 shows the principle of the circuit arrangement according to the invention, FIG. 2 shows a possible embodiment of the circuit arrangement according to the invention in which the impedance converter and the switch consist of separate transistors FIG. 3 shows a possible embodiment of the circuit arrangement according to the invention in which the impedance converter is provided and formed in such a manner that it is also active as an electronic switch FIG. 4 shows an improved modification of the embodiment of FIG. 3 and FIG. 5 shows an embodiment in which a plurality of semiconductor elements are common for all impedance converting switches.

FIG. 1 shows at 1 a tuning potentiometer which is arranged between the common ground potential having an operating voltage of, for example, + 30 V. This tuning potentiometer 1 is connected through a switch 2 to the output A which provides a direct voltage for the variable capacity diode 3. The tuning potentiometer 4 for another transmitter is connected in parallel with the tuning potentiometer 1. This potentiometer is adjusted at a different direct voltage value and can be connected through the switch 5 to the output A while the circuit arrangement is designed in such a manner that every time only one tuning potentiometer is connected to the common output A and consequently to the variable capacity diode 3.

The invention relates to an electronic embodiment of the switches 2 and 5 and consists in that in the embodiment described hereinafter according to FIG. 2 the described impedance converters 6 and 7 are arranged between the switches 2, 5 etc. In the embodiment according to FIG. 3 the switch is joined to a unit together with the impedance converter.

In FIG. 2 the reference 8 denotes the point which corresponds in FIG. 1 to the tap on the potentiometer and where it is also denoted by 8. Further supply voltages are a voltage of + 30 V at 10 and a voltage of + 12 at 11. 9 is the common ground connection. The output of the tuning voltage is denoted by A as in FIG. 1. The voltage by which the switch T7 T8 can be blocked is applied at 12.

The impedance converter consists of the transistors $T_1$, $T_2$, $T_3$, $T_4$, $T_5$ and $T_6$ and the electronic switch consists of the transistors $T_7$ and $T_8$. $T_9$ is a switching transister which becomes conducting when it is controlled accordingly and which blocks the analog switches $T_7$ and $T_8$. The other transistors shown provide the current supply.

In FIG. 3 the input is denoted by 8 while the output voltage appears at A. A common direct voltage of + 30V is present at 10 and the common ground connection is present at 9. The voltage is applied at 12 from the operation device and 11 is connected from the exterior to a direct voltage so as to apply a current of, for example 100μA to the output of the impedance converter.

The impedance converter and also the electronic switch consist of the transistors $T_{20}$, $T_{21}$, $T_{22}$, $T_{23}$, $T_{24}$, $T_{25}$ (in conformity with $T_9$ of FIG. 2) is the switching transistor which controls the electronic switch. The other circuit arrangement shown serves for the supply of the operating voltage.

The operation of the circuit arrangement is as follows: the impedance converter essentially consists of a difference amplifier ($T_1$ and $T_2$ in FIG. 2 and $T_{20}$, $T_{21}$ in FIG. 3), a current mirror ($T_3$, $T_4$ and $T_5$ in FIG. 2 and $T_{22}$, $T_{23}$ in FIG. 3) and an emitter follower ($T_6$ in FIG. 2 and $T_{24}$ in FIG. 3).

The emitter follower provides for the actual impedance conversion while the difference amplifier and the current mirror provide for the $U_{BE}$ and the temperature compensation.

The difference amplifier ($T_{20}$, $T_{21}$ in FIG. 3) provides collector currents in conformity with the difference of the base voltages. For equal collector currents this difference must be equal to zero. The current mirror ($T_{22}$, $T_{23}$ in FIG. 3) always applies the same current to the $T_{23}$ collector of $T_{23}$ which current is applied as a reference value to the collector of $T_{22}$. The collector current which in this case is provided by $T_{20}$ is distributed so that, for example, for a current amplification of $\beta=98$ of the transistors $T_{22}$ and $T_{23}$ 98% of the current flows in the collector $T_{22}$ and 1% flows to the bases of $T_{22}$ and $T_{23}$. Since the base emitter voltages of $T_{22}$ and $T_{23}$ are equal to each other, the same collector currents also flow in $T_{22}$ and $T_{23}$ (in case of equal transistor geometry or size). The collector current of $T_{23}$ thus provides 98% of the collector current flowing from $T_{20}$ and this substantially independent of the collector voltage, hence operating as a current generator.

The negative feedback through the transistor $T_{24}$ to the base of $T_{21}$ ensures that the base of $T_{21}$ is adjusted in such a manner that the collector currents of $T_{23}$ and $T_{24}$, excluding the base current of $T_{24}$, are equally large. This due to the current mirror the collector currents of $T_{20}$ and $T_{21}$ are also equally large and the $U_{BE}$ values of $T_{20}$ and $T_{21}$ compensate for each other completely. The temperature drift then becomes minimal.

This is exactly the opposite of a simple emitter follower to which for the purpose of compensation of $U_{BE}$ a diode is arranged before the base. Generally, different currents flow through the previously arranged compensation diode and the base emitter diode and the compensation is not complete.

The current mirror in FIG. 2 with $T_3$, $T_4$ and $T_5$ principally has the same properties as that in FIG. 3 ($T_{22}$, $T_{23}$), that is to say, the current flowing from the collector of $T_1$ is mirrored relative to the positive battery voltage and flows from the collector of $T_5$ at substantially the same value. This circuit is built up with three transistors because the lateral pnp transistors only have a low current amplification $\beta$ which is between approximately two and fifteen. A better approximation of the value of the mirrored current relative to that of the input reference current is obtained, that is to say, the error of the current mirror then becomes smaller.

The actual analog switch is provided in FIG. 2 behind the impedance converter ($T_7$ and $T_8$) this is necessary because $T_1$ and $T_2$ can only stand a base-emitter blocking voltage of approximately 6 V while the tuning to be switched over can only be between 1 and 28 V. This transistor switch operates in such a manner that in the switched-on condition a base current of approximately 10 μA is supplied by the current generator $T_{10}$. This 10μA thus flows independently of the collector-emitter voltage of the transistor $T_{10}$ and it is only dependent on the base emitter voltage. The 10μA is distributed through two equal base resistors over the two oppositely arranged switching transistors $T_7$ and $T_8$ and drive these transistors into the conducting state. For a full compensaton of the two collector-emitter voltages of $T_7$ and $T_8$ they are oppositely arranged and in order that the two collector emitter voltages are equally large, approximately equal currents are passed through $T_7$ and $T_8$. To this end the current generator $T_{11}$ applies a current which is twice as large including the base current of $T_{10}$ to the emitters of $T_7$ and $T_8$ as is derived from the output by the current generator $T_{12}$. Thus, for example, 10 μA flows from $T_{10}$, 210 μA flows from $T_{11}$ and 100 μA flows from $T_{12}$. The difference left is 100 μA which then flows through $T_7$ and is derived from the impedance converter so that equal currents of 100 μA each flow at the emitters of $T_6$, $T_7$ and $T_8$. The $U_{CE}$ values are then equal and eliminate each other.

When the described analog switch is to be blocked, the switching transistor $T_9$ is brought to the conducting state so that its collector substantially conveys the zero potential. In that case also the base electrodes of $T_7$ and $T_8$ are substantially at zero potential (ground) and are blocked. The collector current of $T_{10}$ (10 μA) then flows in the collector of $T_9$. The tuning voltage of the associated tuning potentiometer provided by the impedance converter is then present at the collector of transistor $T_7$. However, this tuning voltage can no longer reach the output A.

The current generator $T_{12}$ at the output A is present only once for all analog switches and derives the current from only one analog switch which is switched on. This also applies to FIG. 3. The current generator $T_{13}$ derives current only once from the connection through the lead to A. The current generator at the output is necessary to recharge the filter capacitor of, for example, 0.5 μF connected to the output for filtering possible hum and interference voltages in a period of less than 0.1 second at the adjusted tuning voltage after a switch-over. In case of a switch-over from 1 V to 28 V a recharge period of 135 ms is required for example at 0.5 μF and 100 μA. Recharging is effected completely linearly at a rate of 200 V/sec since a constant current source draws 100 μA in this case at the output ($T_{12}$ in FIG. 2, $T_{13}$ in FIG. 3).

In FIG. 3 the impedance converter also takes over the function of the analog switch. When this switch is to be blocked, $T_{25}$ is brought to the conducting state and the value of 10 μA from the current generator $T_{26}$ is taken over by $T_{25}$. The collector of $T_{25}$ and hence the emitters of the two PNP transistors $T_{20}$ and $T_{21}$ are brought to substantially zero potential. As a result $T_{20}$ and $T_{21}$ are cut off. The adjusted voltage of the associated potentiometer then remains at the input 8 and the tuning voltage of the other switched-on analog switch becomes available at the output A.

In FIG. 4 the pnp output emitter follower $T_{24}$ is replaced by an output amplifier which is common for all programmes and which consists of the transistors $T_{24}$ and $T_{42}$. The plural-collector transistor $T_{42}$ constitutes a current mirror, that is to say the current supplied by the collector of the transistor $T_{24}$ is applied to the output with the same value by the second collector of the plural collector transistor $T_{42}$.

The current generator, in this case transistor $T_{45}$ is arranged with respect to ground. In FIG. 3, however, the relevant pnp current generator $T_{13}$ was connected to +30 V.

The advantages obtained by this principle of the output amplifier are: a low minimum of the tuning voltage at the output which is determined by the saturation voltage of the current generator (the transistor $T_{45}$), a voltmeter connectable between the output and the common reference point, in this case ground, for indicating the tuning voltage and a better symmetry in the difference amplifier of the transistors $T_{20}$ and $T_{21}$ and hence improved drift properties on account of the transistors $T_{22}$, $T_{23}$ and $T_{20}$, $T_{21}$ having equal collector voltages adjusted by this output amplifier.

As compared with FIG. 3 the principle of the operational amplifier including a switch and consisting of the transistors $T_{20}$, $T_{21}$, $T_{22}$, $T_{23}$ and $T_{25}$ has remained unchanged. The output signal from the chosen operational amplifier is, however, not directly applied in the improved circuit arrangement according to FIG. 4 through an emitter follower to the output, but controls the base of the transistor $T_{24}$ in such a manner that the collector current mirrored through the plural collector transistor $T_{42}$ becomes equally large as the collector current of the current generator or transistor $T_{45}$. The output voltage then obtained is compared with the relevant input voltage at 8 by the difference amplifier which consists of the transistors $T_{20}$ and $T_{21}$. Consequently when the input voltage at 8 and the output voltage at A are not equal, the collector of the transistor $T_{21}$ or of the transistor $T_{23}$ provides a corresponding correction signal for the base of transistor $T_{24}$ until the difference between the signal at the input 8 and the signal at the output A becomes zero.

The circuit arrangement according to FIG. 4 thus has the following advantages with respect to that of FIG. 3.

1. The output voltage at A may be extra loaded for the purpose of indicating the tuning voltage by means of an instrument relative to the common reference point or ground. The collector current of the transistor $T_{42}$ with various collector electrodes is then increased by the current from the instrument. In the circuit arrangement according to FIG. 3 with the output current generator connected to the positive voltage the instrument should also be connected to the positive voltage because the current from the current generator will otherwise be depleted through the instrument to the common reference point or ground.

2. A smaller output voltage can be obtained (0.1 V). The limit therefor is given by the saturation voltage of the transistor $T_{45}$. In the circuit arrangement according to FIG. 3 only minimum voltages of approximately 0.8 V could be obtained. This was caused by the $U_{BE}$ voltage between the base and the emitter of transistor $T_{24}$ of FIG. 3 and the saturation voltage UCE of transistor $T_{23}$ of FIG. 3. A tuning voltage down to 0.3 V is, however, necessary for the modern channel selectors in television display apparatus.

3. In the improved circuit arrangement according to FIG. 4 the collector emitter voltages of the transistors $T_{20}$ and $T_{21}$ are substantially equally large as well as those of the transistors $T_{22}$ and $T_{23}$. This was not the case in the circuit arrangement according to FIG. 3. Because of the better symmetry of the difference amplifier and of the current mirror with the transistors $T_{22}$ and $T_{23}$ a still smaller offset is produced between the input and output voltages of approximately 2 mV relative to a comparable voltage offset of approximately 8 mV in FIG. 3. As a result a still smaller temperature drift is produced.

FIG. 5 shows a circuit arrangement for a plurality of impedance-converting analog switches two of which are shown in detail. The first switch is constituted by the transistor pair $T_{1a}$, $T_{2a}$ whose emitters are connected through diodes $D_{1a}$ and $D_{2a}$ to a current generator which can be switched on and off through the terminal 12a from the operating device. $T_3$, $T_4$ and $T_5$ constitute a current mirror in the same manner as in FIG. 2 which is in this case common for all switches. To this end the control input of the current mirror, which is the base electrode of $T_5$, is connected to all interconnected collector electrodes of the transistors $T_{1a}$, $T_{1b}$ etc. The output of the current mirror, i.e. the collector electrode of $T_5$, is connected to all interconnected collector electrodes of the transistors $T_{2a}$, $T_{2b}$ etc. The output of the current mirror is also connected to the input of the current amplifier emitter follower $T_6$ which is common for all switches an whose emitter electrode is connected to the output A and to all base electrodes of the transistors $T_{2a}$, $T_{2b}$ etc. In this manner a large economy of semiconductor elements is obtained. The operating device is formed in such a manner that every time only one of the current generators $T_{14}$ is operative. Only the difference amplifier $T_1$, $T_2$ associated with this generator will therefor conduct current and the common current mirror $T_3$, $T_4$, $T_5$ and the common emitter follower $T_6$ will always balance the currents of the conducting difference amplifier and will pass on the input voltage of the conducting difference amplifier to the output A.

What is claimed is:

1. A circuit for supplying a tuning voltage to a voltage variable reactance tuning element from a variable voltage source, said circuit comprising input means for receiving said variable voltage and impedance converter switching means for selectively applying said tuning voltage to said element, said converter and switching means comprising a differential amplifier coupled to said input means and having a pair of transistors each having emitter, base, and collector electrodes, a switching current source coupled to said transistors, and feedback means for insuring substantially equal current flow in said transistors comprising a current mirror coupled to said collectors of said transistors and a feedback amplifier coupled to the collector of one of said transistors, said feedback amplifier comprising a current amplifier including a transistor stage arranged in common emitter configuration, and a phase inverter stage coupled between said current amplifier and said transistors.

2. A circuit arrangement as claimed in claim 1, said impedance converter switching means comprising means for switching off the current from the said current source to the transistors.

3. A circuit arrangement as claimed in claim 1, said variable voltage source comprising a plurality of tuning potentiometers, a switch means for each tuning potentiometer for switching the tuning voltage of the associated tuning potentiometer to the tuning element, each switch means comprising a difference amplifier including first and second transistor stages and a current source coupled to the emitters, said current amplifier being common for all switches and coupled to the joint base inputs of all second transistor stages.

4. A circuit arrangement as claimed in claim 3, wherein said current mirror is common for all switches and controlled by the joint collectors of all first transistor stages and being coupled to the joint collectors of all second transistor stages.

5. A circuit as claimed in claim 1 wherein said phase inverter comprises a current mirror.

* * * * *